United States Patent [19]

Neudeck

[11] Patent Number: 4,829,016
[45] Date of Patent: May 9, 1989

[54] BIPOLAR TRANSISTOR BY SELECTIVE AND LATERAL EPITAXIAL OVERGROWTH

[75] Inventor: Gerold W. Neudeck, West Lafayette, Ind.

[73] Assignee: Purdue Research Foundation, West Lafayette, Ind.

[21] Appl. No.: 110,215

[22] Filed: Oct. 19, 1987

[51] Int. Cl.$^4$ .......................................... H01L 21/265
[52] U.S. Cl. .......................................... 437/31; 437/9; 148/DIG. 26
[58] Field of Search ....................... 437/31, 33, 63, 89, 437/90; 148/10, 11, 26, 50, 164

[56] References Cited

U.S. PATENT DOCUMENTS

| | | | |
|---|---|---|---|
| 3,558,375 | 1/1971 | Engler | 437/90 |
| 3,853,644 | 12/1974 | Tarui et al. | 437/90 |
| 4,504,332 | 3/1985 | Shinada | 437/31 |
| 4,530,149 | 7/1985 | Jastrzebski et al. | 437/90 |
| 4,619,033 | 10/1986 | Jastrzebski | 437/34 |
| 4,637,127 | 1/1987 | Kurogi et al. | 148/DIG. 26 |
| 4,685,199 | 8/1987 | Jastrezebski | 437/54 |
| 4,686,758 | 8/1987 | Liu et al. | 437/34 |

FOREIGN PATENT DOCUMENTS 2113465 8/1983 United Kingdom ....... 148/DIG. 26

Primary Examiner—Donald L. Walton
Attorney, Agent, or Firm—Barnes & Thornburg

[57] ABSTRACT

Silicon epitaxial lateral overgrowth (ELO) techniques are employed to fabricate bipolar transistors. ELO bipolar devices have may advantages in reducing parasitic values. Because the heavily doped buried layer (or sub-collector) is eliminated in ELO structures, $C_{cs}$ is greatly reduced. The concentric collector contact and its closeness to the active collector region reduce $r_c$ in the device. The parasitic collector-to-base capacitance, $C_{cb}$, is also reduced due to oxide-isolation. The ELO device is fabricated using standard silicon-processing equipment. ELO can be accomplished on <100> or <111> silicon substrates.

11 Claims, 4 Drawing Sheets

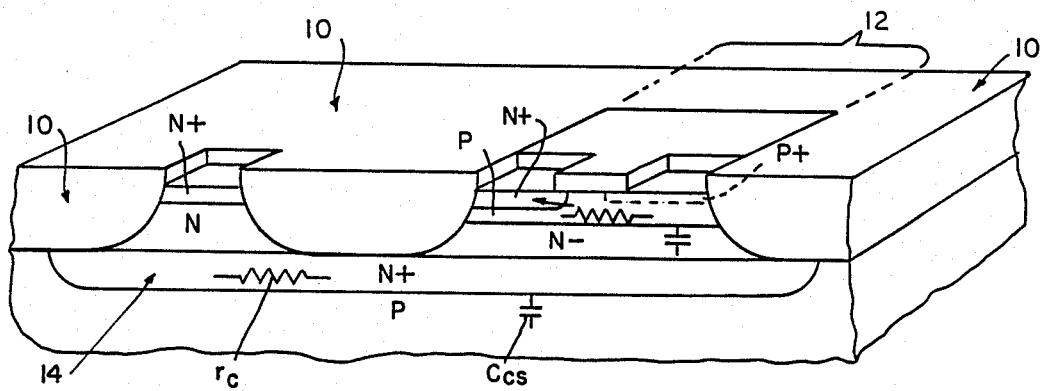
PRIOR ART
FIG. 1
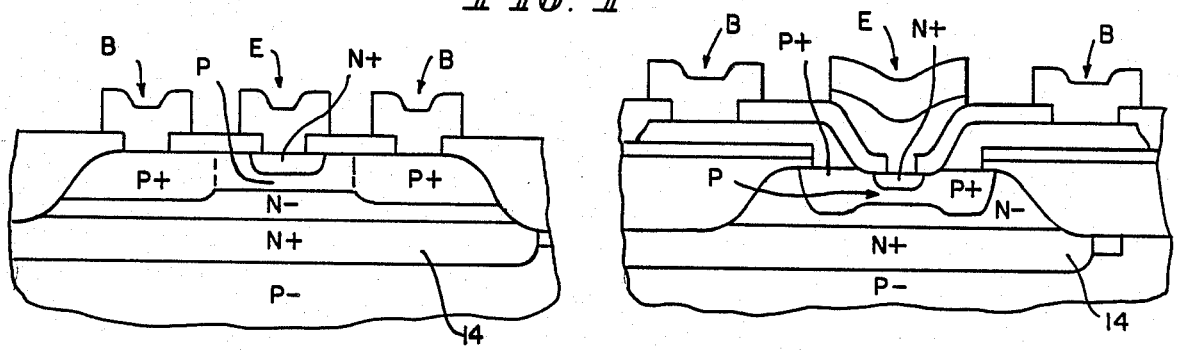
PRIOR ART
FIG. 2(a)
PRIOR ART
FIG. 2(b)
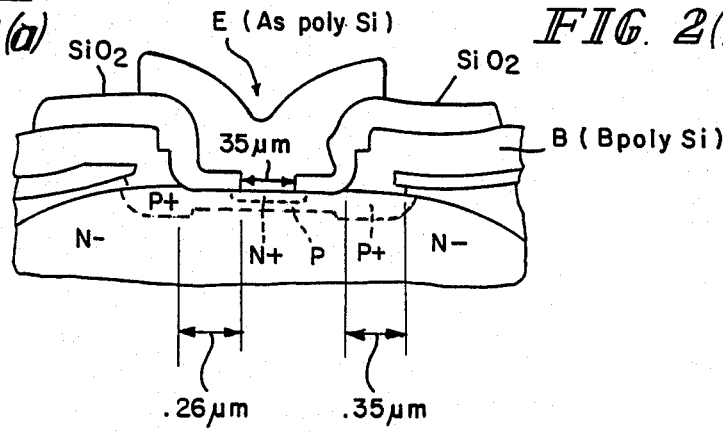
PRIOR ART
FIG. 2(c)

BIPOLAR TRANSISTOR BY SELECTIVE AND LATERAL EPITAXIAL OVERGROWTH

Bipolar junction transistors (BJTs) have been continuously improved in performance since their first application in integrated circuits. In recent years, progress has been made in the fabrication technology of silicon bipolar transistors by shrinking the device dimensions to sub-micron emitter stripes, using thin epitaxial layers, and self-aligned polysilicon emitters. Bipolar devices have been the devices of choice for commercial high speed silicon digital and analog devices for some time.

There are presently three major methods used to fabricate N+PN transistors: (1) junction isolated; (2) oxide sidewall isolated LOCOS, a technique of localized oxidation of silicon; and (3) fully dielectrically isolated. Super self-aligned transistor (SST) emitter and polysilicon emitter devices are new technologies that are showing promise.

1. Junction- LOCOS-, and Oxide Sidewall Isolated Bipolar Devices.

Historically, junction isolated, or diode-isolated, bipolar transistors led the way to the integrated circuits of 1960's and 70's. The first operational amplifiers and digital logic gates used this fabrication technology. These devices established that by "integrating" devices and passive components, circuits could be made in large quantities inexpensively. In some cases junction isolated integrated circuits had superior performance to discrete equivalents.

The most notable problems of the planar approach are: (1) that only one surface is available for contacting the device; and (2) the parasitic junction capacitances that exist on the device sidewalls. The necessary lateral connection scheme for the collector throuqh the substrate introduces additional parasitic resistances and capacitances. Some improvements have been obtained by the use of silicon epitaxy to cover a highly doped, buried collector region.

Major improvements over the junction isolated devices are available using the LOCOS process which eliminates most of the sidewall capacitance from the emitter and base regions. Elimination of sidewall capacitance has been accomplished, as shown in FIG. 1, by growing a thick $SiO_2$ layer 10 to surround the sides of the transistor 12. It should be noted, however, that the buried layer, or sub-collector 14, cannot be eliminated. Hence the resistance $r_C$ of the collector, and the capacitance $C_{cs}$ from collector to substrate (both illustrated diagrammatically), remain about the same as in non LOCOS, junction isolated devices. The device size can be greatly reduced because the metal contacts can overlap onto the field oxide. Otherwise, LOCOS devices are made much the same way as the earlier planar transistors.

Problems associated with the LOCOS fabrication technique include that it can introduce defects due to stress near the oxidizing sidewall, which may result in unacceptable leakage currents in small devices. In addition, the N− collector epitaxy still makes the buried layer difficult to contact and adds series resistance to the collector. A deep N+ contact to the buried layer can be used to reduce the collector resistance, but this requires an additional high temperature step to the fabrication process. The N+ buried layer can also cause such problems as pattern shift, and autodoping reduces the resistivity of the N− collector region.

The base region is doped heavily at the surface in order to: (1)overcome the tendency of P-type impurities to deplete from the surface and to form a lower parasitic base resistance path of $r_{bb}$; and (2) make possible a better base metal contact. Heavy doping of the surface of the base region occurs because the base is diffused into the N− collector epi-material. Because of the high surface doping due to extrinsic base doping, the emitter injection efficiency at the surface is further degraded. The additional hole injection into the emitter adds to the base current which in turn can reduce $\beta_F$. Also the emitter-base junction capacitance per unit area is increased. A uniformly doped base would therefore be desirable, provided the base width is much less than a minority carrier diffusion length.

2. Suoer Self-Alioned (SST) Bipolar Devices

Recently, several super self-aligned transistors (SST) with polysilicon emitters have been discussed in the literature. Shinsuke Konaka, Yousuke Yamamoto, and Tetsushi Sakai, "A 30 ps Si Bipolar IC Using Super Self-Aligned Process Technology" *IEEE Trans on Electron Devices.* Vol. ED-33, No. 4, pp 526–531, April 1986. T. Sakai, S. Konaka, Y. Kobayashi, M. Suzuki, and Y. Kawai, "Gigabit Logic Bipolar Technology: Advanced Super Self-Aligned Process Technology", *Electronics Lett.,* Vol. 19, No. 8, pp. 283–284, 1983. T. Sakai, Y. Kobayashi, H. Yamauchi, M. Sato, and T. Makino, "High Speed Bipolar ICs Using Super Self-Aligned Process Technology", Proc. of 12th Conf. on Solid State Devices, Tokyo, Aug. 1980, pp. 67–68. FIGS. 2(a)-(c) illustrate one such process technology. A key feature of this process for bipolar junction transistors is the automatic alignment of base and emitter with the contacts, which permits the emitter to be scaled down to 0.35 $\mu$m and the base to 1.57 $\mu$m. This reduces the emitter-base and base-collector capacitances. Furthermore, the collector size is somewhat decreased, which affords some relief from the buried collector-to-substrate capacitance. Placing the two polysilicon base contacts very close to the active junction reduces the base resistance. The buried sub-collector is still present in this device structure and represents a limitation on $C_{cs}$ as well as the collector-resistance. In addition the polysilicon has to represent an increased resistance compared to single crystal bulk material. There are also other similarities to LOCOS devices with their inherent limitations.

In summary, standard planar, LOCOS, and SST bipolar transistor designs have a number of disadvantages. One limitation in device speed is a result of the collector-substrate capacitance, $C_{cs}$, formed by the buried layer. The collector resistivity reduces the current drive of the output and therefore also slows the dynamic response of the device. The base resistance, $r_{bb}$, is another important effect. It reduces the controlling current due to the resistor diode voltage divider between emitter and base contacts and therefore decreases the device gain. Collector base capacitance, $C_{cb}$, represents a load on the output of the device and in many linear designs represents the Miller Effect capacitance.

According to one aspect of the invention, a method for constructing a junction semiconductor device comprises the steps of providing a semiconductor substrate, forming a first protective layer on a surface of the substrate, and forming a first opening defined by a first boundary in the first protective layer to expose a region of the substrate surface. The method further includes the step of depositing semiconductor material onto the surface to fill the first opening, the deposition continuing until the deposit extends outward beyond the boundary across the surface of the first protective layer surrounding the boundary to form a first layer of the device. The method then contemplates forming on the first layer of the device a second layer, with a first semiconductor junction being formed at the interface between the first and second layers.

Further according to this aspect of the invention, the step of forming the second layer comprises the steps of forming a second protective layer on the first semiconductor layer, forming a second opening defined by a boundary in the second protective layer, and depositing additional semiconductor material onto the surface of the first semiconductor layer to form the second semiconductor layer.

Additionally, according to this aspect of the invention, the step of forming the second semiconductor layer comprises the step of forming a third protective layer on the surface of the second semiconductor layer.

In addition, according to this aspect of the invention, the method comprises the steps of forming a third opening defined by a boundary in the second protective layer to expose material of the first semiconductor layer, introducing through the third opening impurities to increase the impurity concentration of the first semiconductor layer, and depositing a metallic material onto the increased impurity concentration portion of the first semiconductor layer through the third opening to form an ohmic contact to the first semiconductor layer.

Further according to this aspect of the invention, the method comprises the steps of forming a fourth opening in the third protective layer to expose material of the second semiconductor layer, introducing through the fourth opening impurities to increase the impurity concentration of the second semiconductor layer, and depositing a metallic material onto the second semiconductor layer through the fourth opening to form an ohmic contact to the second semiconductor layer.

Additionally according to this aspect of the invention, the method comprises the steps of forming a fifth opening in the third protective layer to expose the second semiconductor layer, depositing additional semiconductor material through the fifth opening to form a third semiconductor layer, and depositing a metallic material through the fifth opening onto the third layer to form an ohmic contact to the third semiconductor layer. A second semiconductor junction is formed at the interface between the second semiconductor layer and the third semiconductor layer.

According to another aspect of the invention, a junction semiconductor device comprises a semiconductor substrate, a first protective layer on a surface of the substrate, and a first opening defined by a boundary in the first protective layer for exposing a region of the substrate surface. A first semiconductor layer extends from the substrate surface through the first opening and outward from the boundary of the first opening across a surface of the first protective layer. A second semiconductor layer of the device is provided on a second surface of the first semiconductor layer other than the surface of the first semiconductor layer adjacent the first protective layer.

Additionally, according to this aspect of the invention, the device comprises a second protective layer on the second surface of the first semiconductor layer. A second opening defined by a boundary is provided in the second protective layer. The second semiconductor layer extends from the surface of the first semiconductor layer exposed through the second opening and outward from the boundary of the second opening across a surface of the second protective layer to form the second semiconductor layer.

Further, according to this aspect of the invention, a third protective layer is provided on the second semiconductor layer.

In addition, according to this aspect of the invention, a third opening defined by a boundary is provided in the second protective layer for exposing a region of the first semiconductor layer. Means are provided for forming an ohmic contact to the first semiconductor layer on the region of the first semiconductor layer exposed through the third opening.

According to this aspect of the invention, the apparatus includes a fourth opening defined by a boundary in the third protective layer for exposing a region of the second semiconductor layer. Means are provided for forming an ohmic contact to the second semiconductor layer on the region of the second semiconductor layer exposed through the fourth opening.

Illustratively, according to this aspect of the invention, the apparatus further comprises a fifth opening in the third protective layer, a third semiconductor layer on the region of the second semiconductor layer exposed through the fifth opening, and means for forming an ohmic contact to the region of the third semiconductor layer exposed through the fifth opening. A second semiconductor junction is formed at the interface between the second and third semiconductor layers.

The invention may best be understood by referring to the following description and accompanying drawings which illustrate the invention. In the drawings:

FIG. 1 illustrates a cross section through a prior art LOCOS process-generated bipolar transistor;

FIG. 2(a) illustrates a cross section through a 0.5 μm planar transistor;

FIG. 2(b) illustrates a cross section through a prior art SST;

FIG. 2(c) illustrates a cross section through a prior art SST with a 0.35 μm emitter as seen with a SEM;

Silicon epitaxial lateral overgrowth (ELO) has been used to fabricate three dimensional CMOS, also called "stacked gate" or "shared gate" CMOS. The present invention contemplates the use of ELO in the fabrication of silicon bipolar transistors. Using ELO permits the collector epitaxy to be limited to the actual transistor site and permits the elimination of the buried collector. To further reduce its inherent capacitance and resistance, the collector contact is made to the single crystal overgrowth on top of the thick field oxide. The result is a device that has reduced parasitic resistance and capacitance. FIGS. 5(d) and 6(a)-(c) illustrate such structures. The ELO bipolar process requires the ability to perform selective and lateral overgrowth epitaxy.

Figure 3A:
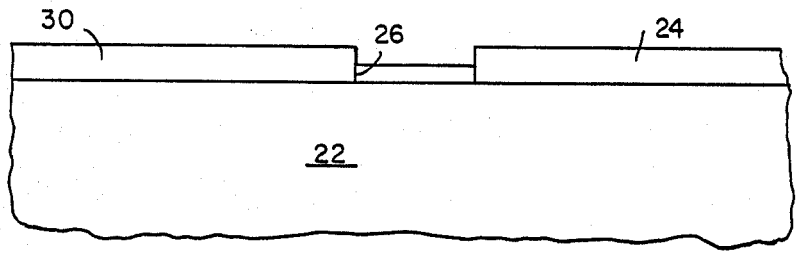
FIG. 3(a) illustrates a cross section of the structure of FIG. 5(d) early in the process of its construction.
Figure 3B:
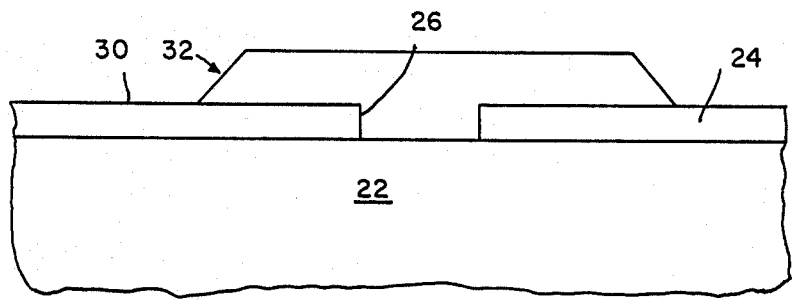
FIG. 3(b) illustrates a cross section of the structure of FIG. 3 later in the process of its construction than illustrated in FIG. 3(a)

Key features of the process of forming ELO on a (100) silicon surface are illustrated in FIGS. 3(a)-(b). A seed window is opened on an oxidized silicon <100> substrate. Epitaxial growth is initiated selectively in the seed windows and progresses vertically until the level of the oxide surface is reached. At this time, the epitaxy also grows laterally over the oxide film, making a dielectrically isolated crystalline silicon layer available for further processing.

Figure 4A:
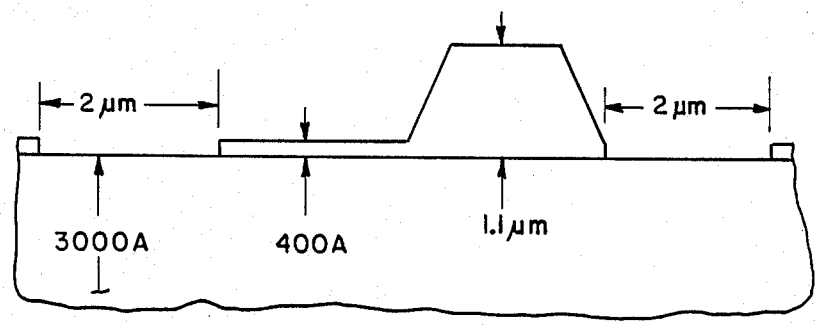
FIG. 4(a) illustrates a cross section of a structure on which epitaxial lateral overgrowth tests have been conducted.
Figure 4B:
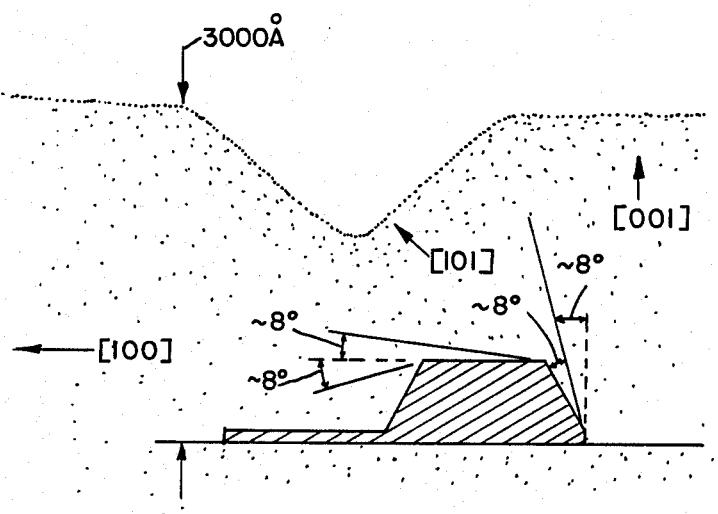
FIG. 4(b) illustrates a scanning electron microscope photograph of the cross section of FIG. 4(a) upon which epitaxial lateral overgrowth has been conducted.

Selective and lateral epitaxy over a 1.1 μm SiO$_2$ step several microns wide has been achieved using this process. R. P. Zingg, G. W. Neudeck, B. Hoefflinger, and S. T. Liu, "Epitaxial Lateral Overgrowth of Silicon Over Steps of Thick SiO$_2$", *Journal of the Electrochemical Society*, pp. 1274–1275, June 1986. S. T. Liu, K. Newstrom, R. J. Stokes, B. Hoefflinger, G. W. Neudeck, R. Zingg, L. Bousse, and J. D. Meindl, "Morphology and Properties of Silicon Islands Grown by Selective Epitaxy Over Silicon Dioxide", *Proceedings Material Research Society Fall Meeting*, Boston, Mass., Dec. 2-7, 1985. FIG. 4(b), a scanning electron microscope (SEM) photograph of the overgrowth cross section, illustrates a cross section and growth planes of the structure.

More recently ELO over oxidized polysilicon gates has been realized. As illustrated in FIG. 4(b), the polysilicon is 3000A thick and is covered with 400A of SiO$_2$. Clear, crisp facets can be detected in the overgrowth from a rectangular 2 μm wide seed window in the gate oxide located between two poly gates. The gate oxide is 400A thick and the field oxide is about 1.1 μm thick. In FIGS. 4(a)-(b) are two 2 μm×2 μm seed windows from which overgrowth occurs.

The <100> substrates result in a vertical growth that is very rapid, with growth rates of about 0.2 μm/min. As a result, the aspect ratio (the ratio of lateral growth to vertical growth) is about 1:1 in this figure. From these preliminary results, it is has been demonstrated that ELO can be performed with crystalline quality sufficient to build high-gain bipolar junction transistors.

The work on <100> ELO has been performed with a Gemini I, R-F heated, reduced pressure, epitaxial reactor. ELO was produced using mixtures of dichlorosilane and HCl in a hydrogen carrier gas. The pressure of the reactor was from 150 to 200 Torr at temperatures of 900° C. to 1025° C. A fabrication process with 2 μm feature sizes has been established. Therefore it has been demonstrated that a high-density, low parasitic resistance and capacitance, ELO bipolar design can be realized.

A more detailed fabrication sequence for an N+PN ELO bipolar device is shown is FIGS. 5(a)-(d). The actual processing proceeds generally as follows.

Figure 5A:
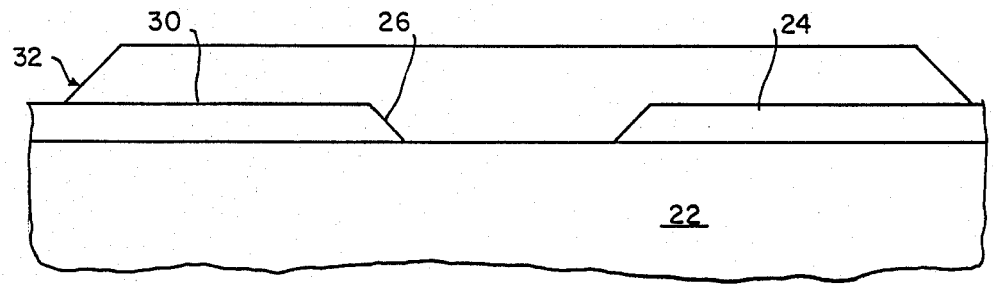
FIG. 5(a) illustrates a cross section of a silicon substrate after the initial phases of processing to form an ELO bipolar transistor.

First, referring to FIG. 5(a), a 0.5 μm to 2 μm field oxide is grown on P-type <111> or <100> silicon and etched using a first mask to define seed openings for the transistor sites. The windows can be made of any suitable size, for example, 2 μm×2 μm.

Next, ELO silicon is grown selectively in these openings to a lateral overgrowth width necessary for contacting the collector. A good aspect ratio is desirable to keep the collector epi-layer thin. However, if not, a planarization step can be used to thin the vertical growth. This collector epi-layer can be grown lightly doped N type or implanted and driven. The majority of the collector is dielectrically isolated from the substrate, and no buried layer is necessary.

Figure 5B:
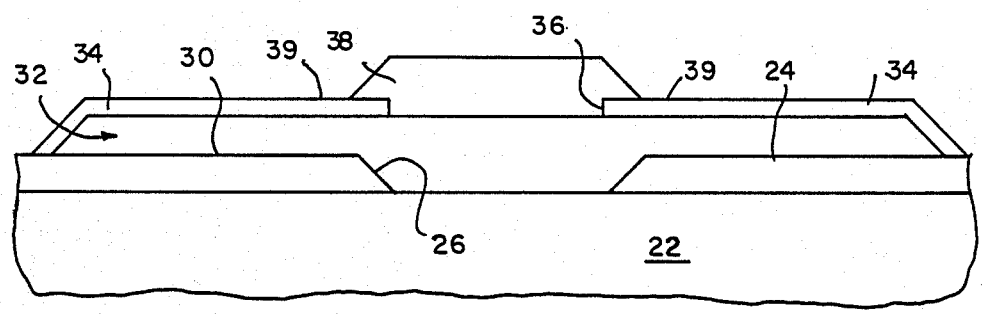
FIG. 5(b) illustrates a cross section of the partially processed substrate after additional phases of processing.

The collector area ELO is next oxidized to a thickness of 0.05 μm to 0.2 μm, as shown in FIG. 5(b). Windows are then opened using a second mask for the collector contact N+ implant in the lateral overgrowth region. The active collector is over the bulk epi-growth and the contacting region is in the lateral overgrowth. Hence the overgrowth material need not be of perfect quality.

Next, the ELO collector is re-oxidized and the first mask is again used to open a seed area for the base ELO. The base ELO is grown lightly doped p-type. Alternatively, it can be grown intrinsic and then have impurities implanted. The base doping can be graded or uniform.

Figure 5C:
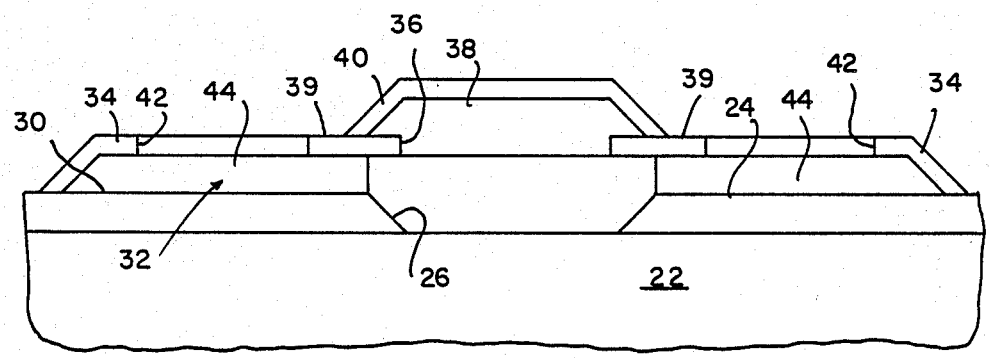
FIG. 5(c) illustrates a cross section of the partially processed substrate after additional phases of processing.

Referring to FIG. 5(c), P+ base contact implants are next performed over the lateral overgrowth epi-material, but along the edges using a third mask. The base region P+ contact implants can be made to completely surround the active base region. The P+ contact implants are dielectrically isolated from the collector contacts.

The base ELO is next oxidized and is now ready for the emitter. Either the standard N+ arsenic implanted and diffused emitter or a polysilicon emitter can be realized. In either case the surface of the emitter is dielectrically isolated so that a heavily doped base surface is not necessary.

Figure 6A:
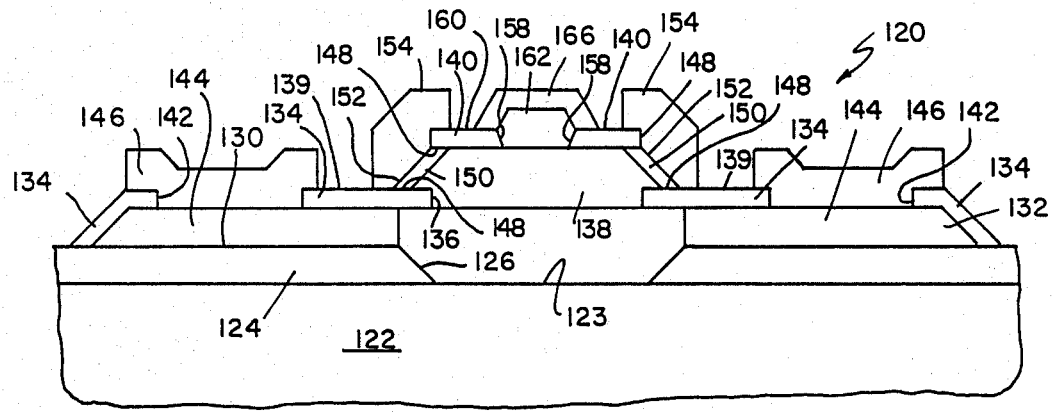
FIG. 6(a) illustrates a cross section of an ELO-processed bipolar transistor with a polysilicon emitter.

Referring now to FIG. 6(a), for a polysilicon emitter, 500 nm of polysilicon with N+ doping is deposited either to form an emitter contact or the N+ emitter itself. Shinsuke Konaka, Yousuke Yamamoto, Tetsushi Sakai, "A 30ps Silicon Bipolar I.C. Using Super Self Aligned Process Technology", IEEE Transactions on Electron Devices, Vol. ED 33, No. 4, p. 526, April 1986. The polysilicon can be patterned with the first mask by using a negative photoresist. The base surface and emitter polysilicon are oxidized for self-isolation.

Contact windows are opened for the emitter, base and collector using a fourth mask. Finally, the metalization is vacuum evaporated or sputtered onto a photoresist lift off pattern using a fifth mask and defined.

Figure 6B:
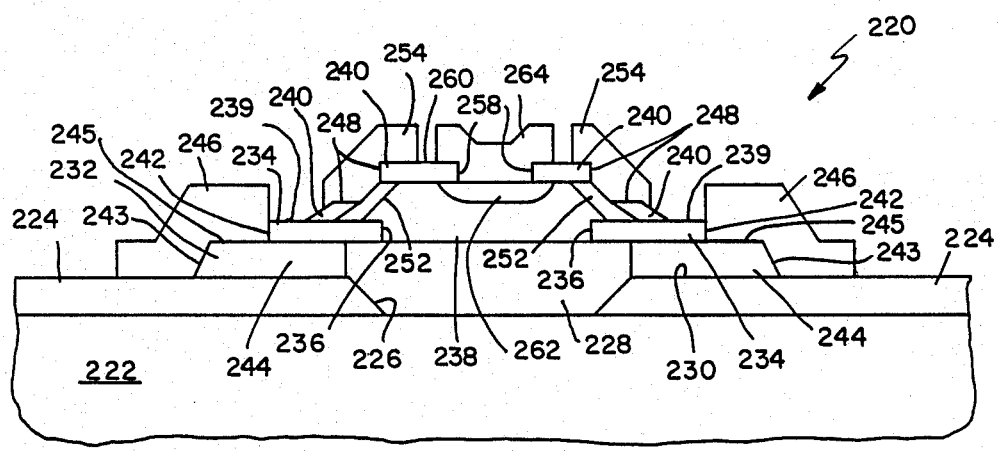
FIG. 6(b) illustrates a cross section of a reduced-size, ELO-processed, bipolar transistor.
Figure 6C:
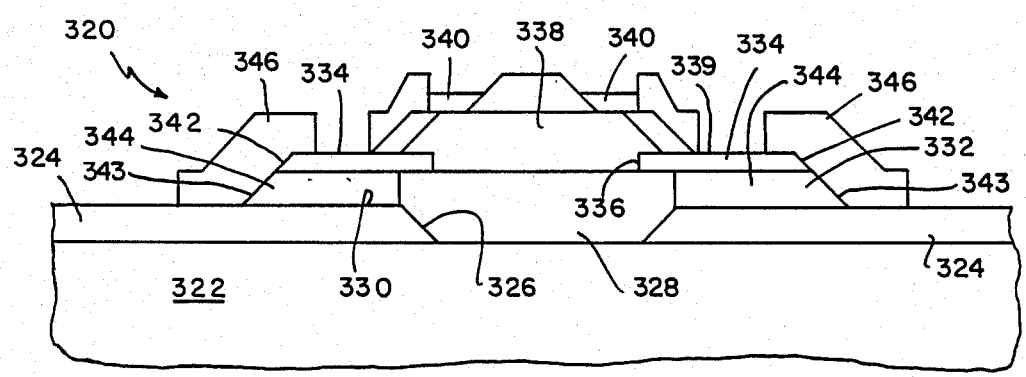
FIG. 6(c) illustrates a cross section of a reduced-size, ELO-processed, bipolar transistor with a polysilicon emitter.

This processing scheme is moderately insensitive to misalignment, since the locations of contact implants are not critical. ELO bipolar technology provides a large variety of possibilities in implementing bipolar structures. Some of these possibilities are illustrated in FIGS. 6(a), (b) and (c). All of the devices realized in the embodiments of FIGS. 6(a)-(c) are characterized by reduced collector parasitic resistance and capacitance.

The restricted and lateral epitaxial growth, technique eliminates the buried layer or sub-collector in fabrication of silicon bipolar transistors, while maintaining the oxide sidewall isolation. Several of the parasitic parameters of bipolar transistors so fabricated are decreased. In particular, the collector to substrate capacitance, $C_{cs}$, the collector-to-base capacitance, $C_{bc}$, collector resistance, $r_{cc}'$, and base resistance, $r_{bb}'$, are all reduced.

As an additional advantage, a collector buried layer is not needed. The junction between substrate and collector can be lightly doped on both sides, leading to wide depletion regions. The collector-substrate capacitance is thus decreased and speed is improved. Only a small seed window area is required.

In addition, the collector contact is in close proximity to the N− collector, thereby reducing the collector resistance, which also results in improved driving capability and better speed. The N+ collector contact can surround the device and metal can contact the device on any side. Significant improvements in base resistance can be obtained, since the P+ contact is situated very close to the active area and can be made concentrically around the base. Therefore the P+ contact can be contacted with metal on both sides of the emitter. The collector base capacitance Cbc is decreased, as the active area of the junction is greatly reduced. The highly doped contact areas of the base and collector are dielectrically isolated from each other. No high concentration P-type implants are needed in the base surface close to the emitter to prevent surface inversion. The emitter injection efficiency at the surface is thereby improved since the lateral injection of holes from the base surface to the emitter is greatly reduced. This reduced hole back injection can increase the beta of the device.

The area requirement is very small. By using 2 μm design rules, a 14 μm device from collector contact to collector contact can be laid out. This dimension is limited by the metal connection requirements and compares favorably to other designs. Some circuit density can be gained by metalizing the highly doped base and collector contacts only on alternate sides.

A comparison of ELO to the state-of-the-art SST device shows that ELO provides a number of improvements. No buried collector is needed using ELO fabrication techniques. Therefore, the output capacitance is reduced. The base contact is metal to highly doped crystalline silicon, rather than a polysilicon bridge. Emitter efficiency is improved, as a junction between N+ emitter and P+ base contacts is avoided. Although the size of the ELO device is larger than the SST, the ELO device has smaller parasitic resistance and capacitance. Finally, the fabrication of the ELO bipolar device is much simpler than fabrication of the SST.

In FIGS. 3(a)–(b) and 5(a)–(d), an ELO bipolar transistor 20 is fabricated on a <100> or <111>, P type substrate 22. In the first phase of fabrication, illustrated in FIG. 3(a), a SiO2 layer 24 is grown on substrate 22. A seed window 26 is then opened at the future location of the transistor 20. N− type silicon is grown epitaxially upward from the surface of substrate 22 through the seed window 26 as best illustrated in FIG. 3(a). Once the epitaxial growth reaches the surface 30 of the SiO2, it grows laterally 32 across the surface 30 in all directions as it continues to grow upward. This is best illustrated in FIGS. 3(b) and 5(a). This growth phase is completed when the epitaxial lateral overgrowth 32 reaches the desired collector size for the bipolar transistor 20. This desired collector size 32 is illustrated in FIG. 5(a).

Next, the overgrowth 32 is oxidized to a depth substantially less than its thickness. This SiO2 layer 34 is best illustrated in FIG. 5(b). A seed window 36 is opened through SiO2 layer 34 as illustrated in FIG. 5(b). The same mask may be used in opening window 36 as was used in opening window 26, if desired. A second epitaxial layer 38 is next grown up through window 36 and laterally out across the surface 39 of SiO2 layer 34 to the desired dimensions of the base of transistor 20. Layer 38 is grown as P− type silicon.

In the next step of the process, best illustrated in FIG. 5(c), an SiO2 layer 40 is formed over the base P− type epitaxy 38. Next, windows 42 are opened through SiO2 layer 34 in the regions where collector contacts are to be formed. The silicon 44 thus exposed beneath these windows is diffusion (or otherwise) doped N+ type.

Figure 5D:
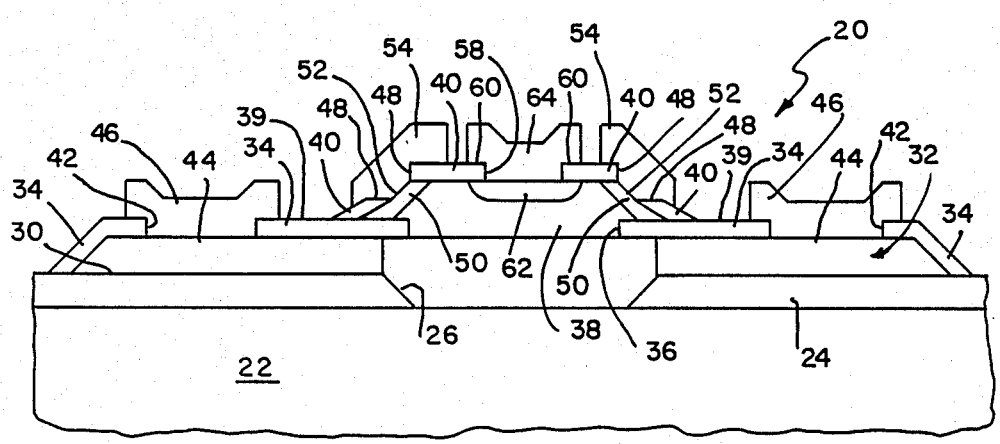
FIG. 5(d) illustrates a cross section of the completed epitaxial lateral overgrowth-processed bipolar transistor.

Next, with reference to FIG. 5(d), windows 48 are opened in the oxide layer 40 at the margins of the base P− type epitaxy 38 and a P+ impurity 50 is diffused (or otherwise implanted) into the base P− region 38 at its margins 52. A window 58 is next opened in the top surface 60 of oxide layer 40 and an N+ impurity is diffused (or otherwise implanted) at 62 into the central region of the base P− epitaxy 38 to form the emitter of the transistor 20. Finally, metallizations 46 forming the collector contacts, metallizations 54 forming the base contacts, and a metallization 64 forming the emitter contact are applied over regions 44, 52, and 62, respectively.

In FIG. 6(a), an alternative construction for a polysilicon emitter ELO bipolar transistor 120 is illustrated. Generally, the steps in the formation of this transistor 120 are as follow.

In the first phase of fabrication, a thick SiO2 layer 124 is formed on a <100> or <111>, P type substrate 122. A seed window 126 is formed in layer 124 at the site of transistor 120. N− type silicon is grown epitaxially upward from the surface 123 of substrate 122 through window 126. Once the epitaxial growth reaches the surface 130 of the SiO2 layer 124, it continues to grow upward, and, in addition, spreads outward beyond the boundaries of window 126 until it reaches the desired collector overgrowth size 132 for transistor 120.

Next, the overgrowth 132 is oxidized to a depth substantially less than its total thickness to provide an SiO2 layer 134. A seed window 136 is then opened in SiO2 layer 134 and a P epitaxial layer 138 is grown up through window 136 and laterally out across the oxide layer 134's surface 139 to the desired dimensions for the base of transistor 120. An SiO2 layer 140 is then formed over the base P− epitaxy 138.

Windows 142 are then opened through SiO2 layer 134 in the regions where collector contacts are to be formed. The silicon 144 thus exposed beneath windows 142 is N+ doped. Windows 148 are then opened in oxide layer 140 at the margins of the base P− type epitaxy 138 and a P+ impurity 150 is doped through windows 148 onto the margins 152 of the base epitaxy 138. A window 58 is next opened in the top surface 160 of oxide layer 140 to expose the base epitaxy 138 and an N+ polysilicon emitter 162 is epitaxially grown through the window 158 on the base epitaxy 138. An SiO2 layer 166 is then grown on the emitter 162. Metallizations 146 forming the collector contacts, metallizations 154 forming the base contacts, and a metallization (not shown)

forming the emitter contact are applied over regions 144, 152, and 162, respectively.

In FIG. 6(b), another construction for a smaller sized ELO bipolar device 220 is illustrated in cross section. Again, the device 220 is fabricated, illustratively on a <100> or <111>, P type substrate 222. A SiO$_2$ layer 224 is formed on substrate 222. A seed window 226 is then opened where device 220 is to be fabricated. An N− collector epitaxy 228 is then grown up through the seed window 226, continuing to grow upward and outward 232 at rates determined by the growth aspect ratios of the crystal structure, as well as other factors, after the growth 228 reaches the surface 230 of layer 224. When the epitaxial lateral overgrowth 232 reaches the desired collector size for device 220, ELO is halted.

The overgrowth 232 is then oxidized to form a layer 234. A seed window 236 is opened through layer 234. A P− type epitaxy is then grown upward through seed window 236 and outward across the surface 239 of layer 234 to the desired dimensions of the base 238 of device 220. An SiO$_2$ layer 240 is then formed over the base P− epitaxy. Windows 242 are then opened in layer 240 to expose the lateral margins 243 as well as some portion of the top surface 245 of the collector epitaxy 228. N+ regions 244 are then doped into the N− collector epitaxy 228 in the regions where contact is to be made to the collector 228.

Next, windows 248 are opened in the oxide layer 240 at the margins of the base P− epitaxy and a P+ impurity is doped into the base P− region 238 at 252. A window 258 is next opened in the top surface 260 of oxide layer 240 and an N+ emitter region 262 is doped into the P− base 238. Metallizations 246, 254, and 264 are then applied over regions 244, 252, and 262, respectively. Collector metallizations 246 use the lateral margins 243 of the collector epitaxy 228 to permit configuration of a somewhat smaller device 220 than would be possible using only the top surface 245 as was done in FIGS. 5(a)-(d). The base metallizations 254 are applied over the P+ marginal regions 252. The emitter metallization 264 is applied over the N+ emitter region 262.

A reduced-size, polysilicon emitter analog to the structure illustrated in FIG. 6(b) is illustrated in cross-section in FIG. 6(c). There, a device 320 begins as a <100> or <111>, P type substrate 322. A SiO$_2$ layer 324 is grown on substrate 322 and a seed window 326 is then opened in oxide 324 at the future site of device 320. An N− collector epitaxy 328 is then grown in seed window 326, growing first upward to the surface 330 of oxide 324 and then upward and outward until the design size of the collector 332 ELO is achieved. The collector epitaxy 332 is then oxidized to form a layer 334 on top of it. A seed window 336 is opened in layer 334 and a P− base epitaxy 338 is then grown through seed window 336 until it reaches the surface 339 of oxide 334. ELO is continued until the base epitaxy 338 reaches design size.

An SiO$_2$ layer 340 is then formed over base epitaxy 338 and windows 342 are opened in layer 340 to expose portions of the lateral margins 343 of collector 328. N+ regions 344 are then doped into the N− collector epitaxy 328 where contact is to be made to collector 328. The remaining steps in the fabrication of device 320 proceed substantially as did the remaining steps in the fabrication of devices 120, 220 of FIGS. 6(a) and 6(b), respectively. Metallizations 346 ultimately are applied over the regions 344 to complete the collector and collector contacts of device 320. As with the embodiment of FIG. 6(b), use of the lateral margins 343 of the collector 328 permits a somewhat smaller device 320 configuration than would otherwise be available.

What is claimed is:

1. A method for constructing a bipolar transistor comprising the steps of providing a semiconductor substrate, forming a first protective layer on a surface of the substrate, forming a first opening defined by a boundary in the first protective layer to expose the substrate surface, depositing semiconductor material onto the substrate surface exposed through the first opening to fill the first opening and form a deposit outward from the boundary of the first opening across the surface of the first protective layer surrounding the boundary to form a first semiconductor layer of the transistor, then forming on the first semiconductor layer a transistor second semiconductor layer, a first semiconductor junction being formed at the interface between the first and second semiconductor layers.

2. The method of claim 1 wherein the semiconductor substraste is a silicon substrate.

3. The method of claim 2 wherein the silicon substrate is a silicon substrate with P type impurities.

4. The method of claim 2 wherein the step of forming a first protective layer on a surface of the substraste comprises the step of oxidizing the surface of the substrate.

5. The method of claim 4 wherein the silicon substrate is a silicon substrate with P type impurities.

6. The method of claim 3 wherein the step of forming the first semiconductor layer comprises depositing silicon with N type impurities onto the substrate surface.

7. The method of claim 1 wherein the step of forming the second semiconductor layer comprises the steps of forming a second protective layer on a surface of the first semiconductor layer, forming a second opening defined by a boundary in the second protective layer, and depositing semiconductor material onto the surface of the first semiconductor layer to form the second semiconductor layer.

8. The method of claim 7 and further comprising the step forming a third protective layer on the surface of the second semiconductor layer.

9. The method of claim 8 and further comprising the step of forming a third opening defined by a boundary in the second protective layer to expose material of the first semiconductor layer, introducing through the third opening impurities to increase the impurity concentration of a region of the first semiconductor layer, and depositing a material onto the region of the first semiconductor layer thruugh the third opening to form an ohmic contact to the first semiconductor layer.

10. The method of claim 9 and further comprising the step of forming a fourth opening in the third protective layer to expose material of the second semiconductor layer, introducing through the fourth opening impurities to increase the impurity concentration of a region of the second semiconductor layer, and depositing a material onto the second semiconductor layer through the fourth opening to form an ohmic contact to the second semiconductor layer.

11. The method of claim 10 and further comprising the steps of forming a fifth opening in the third protective layer to expose a region of the second semiconductor layer, depositing additional material through the fifth opening to form a third semiconductor layers, and depositing material through the fifth opening onto the third semiconductor layer to form an ohmic contact to the third semiconductor layer.

* * * * *

UNITED STATES PATENT AND TRADEMARK OFFICE
CERTIFICATE OF CORRECTION

PATENT NO. : 4,829,016

DATED : May 9, 1989

INVENTOR(S) : Gerold W. Neudeck

It is certified that error appears in the above-identified patent and that said Letters Patent is hereby corrected as shown below:

Title page, Abstract, line 3, please delete "may" and insert therefor --many--;

At Column 2, line 16, please delete "Suoer Self-Alioned" and insert therefor --Super Self-Aligned--;

At Column 2, line 54, please delete "$r_{bb}$" and insert therefor --$r_{bb}'$--;

At Column 7, line 68, please delete "trnnsis-" and insert therefor --transis---;

At Column 8, line 62, please delete "58" and insert therefor --158--;

At Column 10, line 20, please delete "substraste" and insert therefor --substrate--;

At Column 10, line 49, please delete "thruugh" and insert therefor --through--; and At Column 10, line 64, after the word "semiconductor", please insert --layer, a second semiconductor junction being formed at the interface between the second and third semiconductor--.

Signed and Sealed this

Sixth Day of February, 1990

*Attest:*

JEFFREY M. SAMUELS

*Attesting Officer*   *Acting Commissioner of Patents and Trademarks*